United States Patent [19]

Banno

[11] Patent Number: 4,686,457
[45] Date of Patent: Aug. 11, 1987

[54] METHOD FOR MEASURING A SIGNAL'S FREQUENCY COMPONENTS

[75] Inventor: Takuo Banno, Hachioji, Japan

[73] Assignee: Hewlett-Packard Company, Palo Alto, Calif.

[21] Appl. No.: 891,824

[22] Filed: Aug. 1, 1986

[30] Foreign Application Priority Data

Aug. 8, 1985 [JP] Japan ................................ 60-174837

[51] Int. Cl.$^4$ ............................................. G01R 23/16
[52] U.S. Cl. .................................. 324/77 R; 324/77 B
[58] Field of Search ................. 324/77 R, 77 B, 77 C, 324/77 CS, 78 D, 83 D, 79 R; 364/481, 484, 485, 487

[56] References Cited

U.S. PATENT DOCUMENTS 3,883,726  5/1975  Schmidt ........................... 324/77 B
4,054,785 10/1977  Lehmann .......................... 324/77 D
4,057,756 11/1977  Ley et al. ......................... 324/77 B Primary Examiner—Michael J. Tokar
Attorney, Agent, or Firm—Saundra S. Hand; Edward Y. Wong

[57] ABSTRACT

A method is presented for accurately measuring an input signal's frequency components and the amplitude of those components. This is done by digitizing an input signal, passing it through a window, converting it into the frequency domain, and using the Fourier transform of the window to remove the effects of window from the input signal converted into the frequency domain.

5 Claims, 12 Drawing Figures

METHOD FOR MEASURING A SIGNAL'S FREQUENCY COMPONENTS

Field of the Invention

This invention relates to the field of digital data processing, and more particularly but not exclusively, to a post processing method of discrete Fourier transformed data to enhance the accuracy of the data.

BACKGROUND OF THE INVENTION

The digital Fourier transform (DFT) is one of the most efficient ways to determine a signal's frequency domain characteristics. Analysis of the frequency characteristics using DFT is very useful in wide variety of fields such as analysis of the vibration in a mechanical device or measuring distortion of an electronic circuit. The fast Fourier transform (FFT) process is an important component of the DFT process. The DFT process is well known and widely used. The origin of the FFT process is traced back to Carl Friedrich Gauss, the eminent German mathematician, and the history of the FFT is described by Michael T. Heidemann et al. in "Gauss and the History of the Fast Fourier Transform", IEEE ASSP Magazine, pp. 14-21, Oct. 1984.

As is well known, an analog signal is first digitized into discrete time data of N points (numbers) where N is a positive integer. Then the FFT algorithm or other DFT algorithm processes the data to obtain corresponding digital data in frequency domain. Using N sampled data points which are sampled each t over an observation period of T (T=t N), DFT algorithm computes each Fourier spectral component at frequencies of 0 (DC), 1/T, 2/T, ..., M/T. M is (N−2)/2 for even N and (N−1)/2 for odd N.

If the measured signal's frequency components happen to coincide with the above-mentioned discrete frequencies, the computed frequency components are correct in both their amplitudes and phases without any further processing, as is shown in FIG. 4A and FIG. 4B. In FIG. 4A, the bold line 4-1 depicts the measured analog signal and small dots 4-3 depicts sampled digital data. FIG. 4B shows the corresponding continuous Analog Fourier Transformed (AFTed) data 4-5 and Digital Fourier Transformed (DFTed) data 4-7 in arrowed vertical lines and dots respectively.

However, if the measured signal has frequency components other than 0(DC), 1/T, 2/T, ..., M/T in a frequency range equal to or below 1/(2t), the amplitudes of corresponding AFTed data and DFTed data will not be the same as shown in FIG. 5B. The DFT process distorts the amplitude of the actual frequency components and creates additional frequency components around the true frequency components. For example, a continuous analog signal 5-1 has sample data points 5-3 as is shown in FIG. 5A. The DFT processes the sampled data points 5-3 via a rectangular window. FIG. 5B shows the discrepancy between the accurate AFT and the DFT data 5-6 shown in FIG. 5B.

A variety of windows other than rectangular windows have been used to alleviate above-mentioned errors. One of such windows utilizes Hanning window function shown in FIG. 6A and its Fourier transform as shown in FIG. 6B.

The analog signal input shown in FIG. 5A is multiplied by Hanning window function shown in FIG. 6A to produce signal 7-1 and sampled as shown in FIG. 7A. The data samples are DFTed as shown in FIG. 7B. The envelope of the AFT of the input signal 7-7 is shown in FIG. 7B as well as the DFT of the sampled data 7-5. Although the DFTed data 7-5 resides on the envelope of the AFT data 7-7, the DFT data is not available for the entire envelope. Importantly, the peaks of the AFT data are not reflected by the DFT data 7-5. This example illustrates one of the problems of the prior art. In actual practice, the input signal is multiplied by the Hanning window after the input signal is sampled. However, the above description has been given to make it easier to understand. Although many other windows are well known, further description of each is omitted here.

Level errors, leakages and windowings are treated by E. O. Brigham in Chapters 6 and 9 of "The Fast Fourier Transform", Prentice-Hall, Inc., 1974.

Windows have negative effects, however. Generally speaking, higher level accuracy accompanies lower frequency resolution and wider equivalent noise bandwidth. As examples, the Hanning window of 1.5 dB level accuracy gives $1.5 \times (1/T)$ in equivalent noise bandwidth and a flat top window, as shown in FIG. 8. The window can improve level accuracy to 0.1 dB but deteriorate equivalent noise bandwidth to $3.5 \times (1/T)$. The flat top window is described in pages 2–14 of Hewlett-Packard Journal, September 1978 and hereby incorporated into this disclosure.

Another negative effect is leakages in DFTed spectra. When a signal contains spectral components other than 0 (DC), 1/T, 2T, 3T, ..., M/T, the DFTed data contains several spectral components that correspond to a single component in the measured data.

Those leakage spectra components group together. When shown on a CRT they are bothersome, but not a catastropic failure. However, many devices such as integrated circuit testers require precise Fourier spectrum analysis. The leakage spectra components of the prior art cannot be tolerated.

BRIEF SUMMARY OF THE INVENTION

The problems outlined above can be overcome by the present invention which further processes the Fourier transformed input signal. Therefore, one object of the present invention is to very accurately measure the amplitude and frequency of all frequency domain components of an input signal.

To accomplish this, an analog signal is sampled, multiplied by a window function, and DFTed. The DFTed data surrounding the peak response, $f_{in}$, are located at frequencies $f_0, f_1, f_2, \ldots$. The envelope of these frequency components surrounding the peak frequency component, $f_{in}$, corresponds to a dispersion of Fourier transformed window function centered on frequency $f_{in}$ of the true single spectral component. This surrounding data is further processed with the peak response, $f_{in}$, in accordance with one method of the present invention. According to this method, the DFTed frequency components at frequencies $f_0, f_1, f_2, \ldots$, and the Fourier transform of window function are processed to determine the input signal's true spectral components and their amplitude.

An advantage of this invention is to eliminate spurious or leakage responses at frequencies $f_0, f_1, \ldots$, around true signal frequency of $f_{in}$. Computed true spectrum can replace spurious responses and can consequently reduce the size of spectrum data store. Another advantage of this invention is to provide a digitizer with AC level meter capability. In this case of application, a pure sinusoidal input signal is first processed via a rectangular window and further processed using the method of this invention and consequently accurate level and frequency of the signal can be obtained. Another advantage of the invention is the accurate measurement of the spectra components amplitude and frequency.

DETAILED DESCRIPTION OF THE PREFERRED EMBODIMENT

In the following paragraphs of this detailed description of the preferred embodiment, a method for measuring the power spectrum of an analog signal using a Hanning window function is shown.

An analog signal is first sampled at an interval of t seconds. Then these samples are converted into digital data. The digitized signal is multiplied by the Hanning window and subsequently DFTed using the FFT algorithm.

Figure 2:
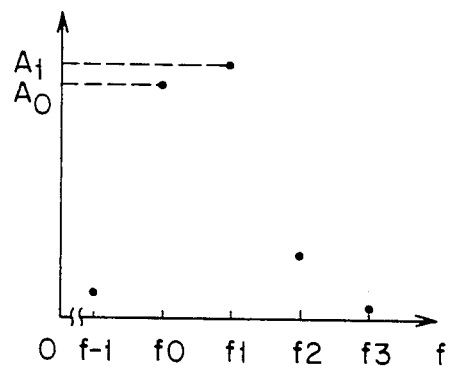
FIG. 2 shows the frequency components of the input signal that has passed through the window H(f).

FIG. 2 depicts the DFTed frequency components. The frequency components $f_0$ and $f_1$ have amplitude levels of $A_0$ and $A_1$ respectively. In FIG. 2, $f_0 = n/T$ and $f_1 = n/T + f_t$, where $f_t = 1/T$.

There are several spectral components of lower amplitude other than the component $f_0$ and $f_1$ such as $f_{-1}$ $f_2$ and $f_3$. Those components are hereinafter neglected because of their small amplitude.

Figure 3:
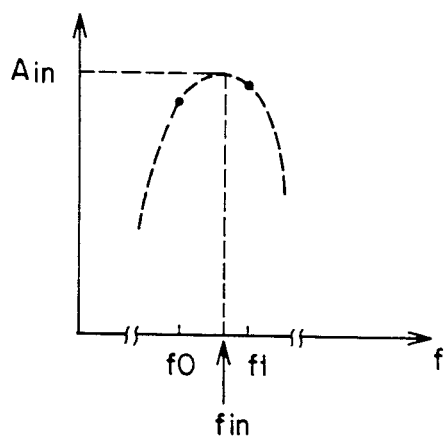
FIG. 3 shows the envelope produced by convolving the fourier transform of the window with an impulse function at $f_{in}$, FIG. 3 and compares this envelope with the measured spectral components $f_1$ and $f_0$.
Figure 4A:
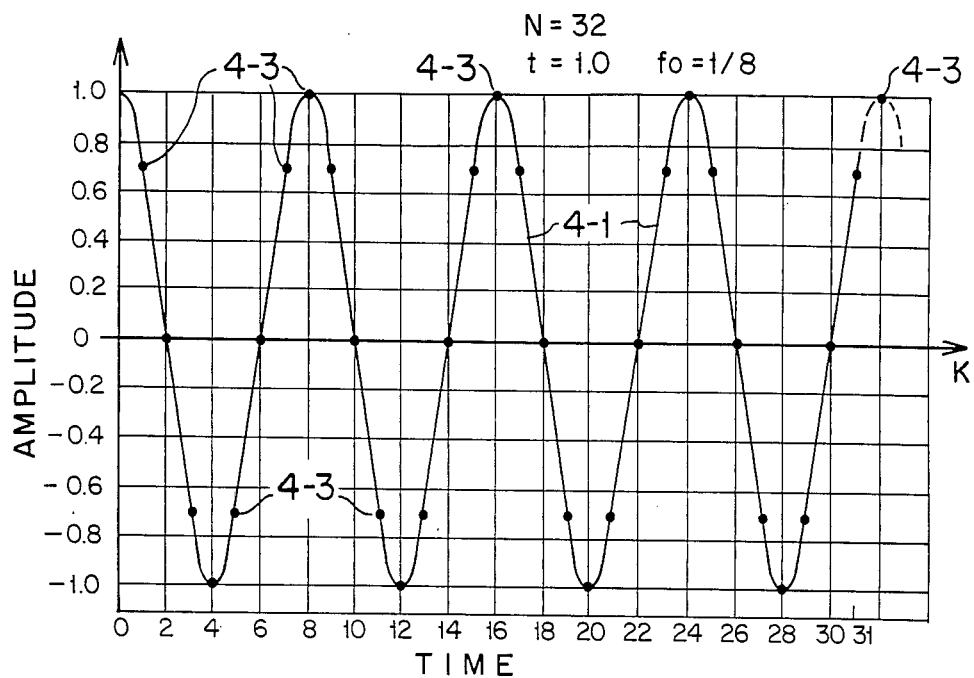
FIGS. 4A and 4B shows an input signal and the resulting digital fourier transform of that input signal when the frequencies at which the fourier transform is computed equals the frequency components of the input signal.
Figure 4B:
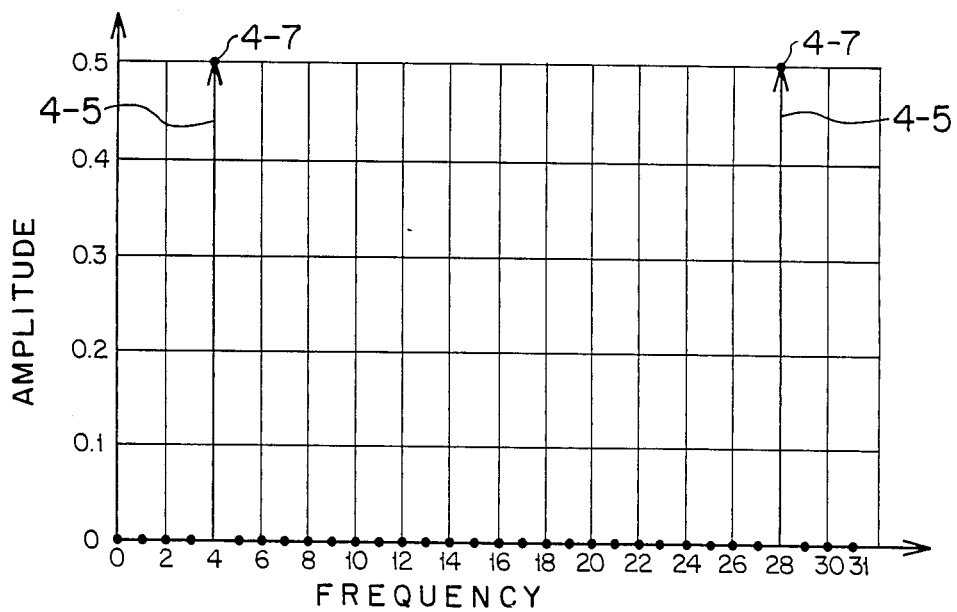
Figure 5A:
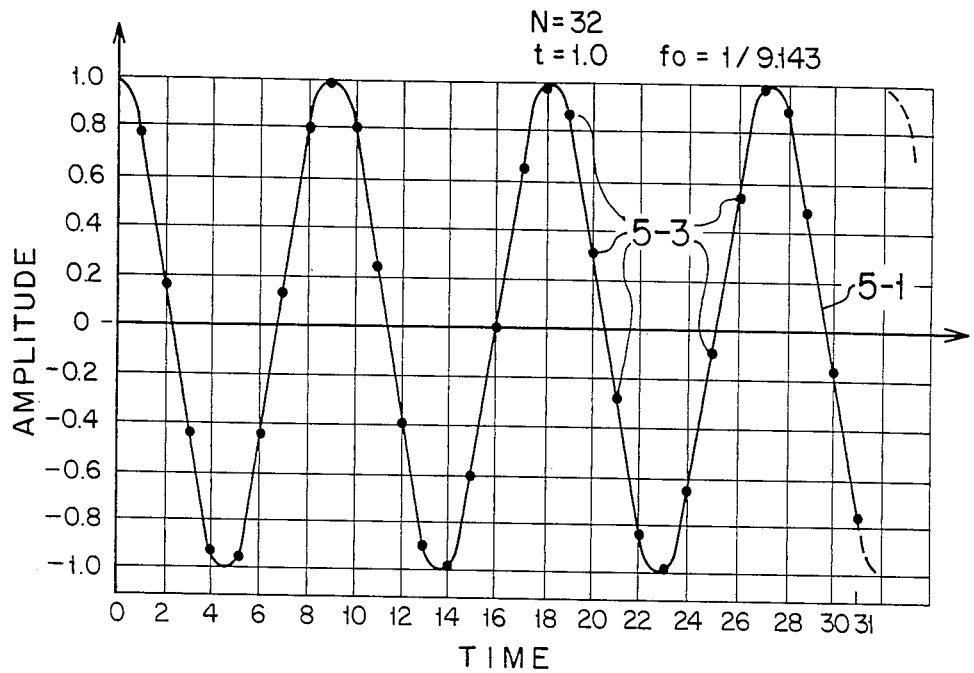
FIGS. 5A and 5B is identical to FIGS. 4A and 4B except that intervals at which the fourier transform is computed does not coincide with the actual frequency components of the input signal.
Figure 5B:
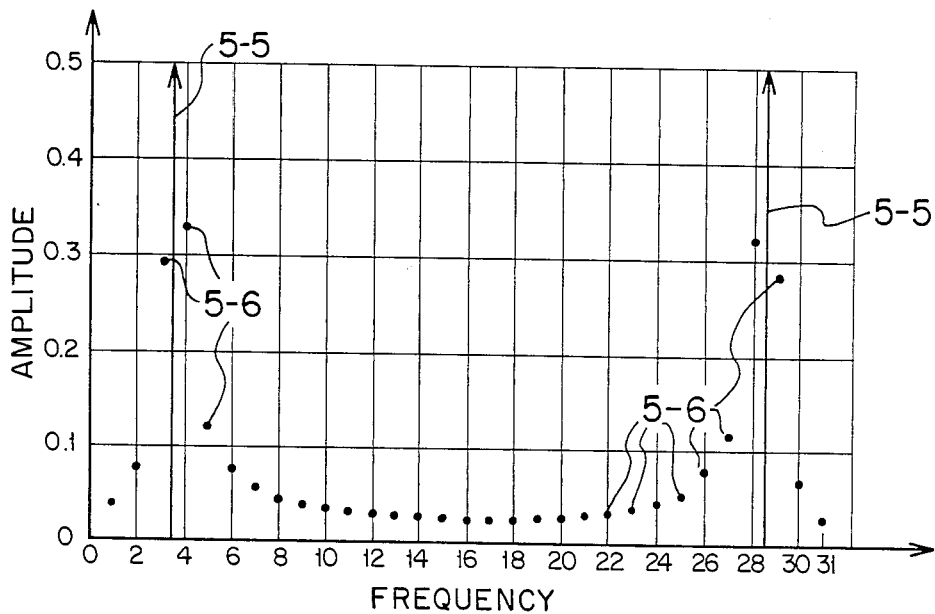
Figure 6A:
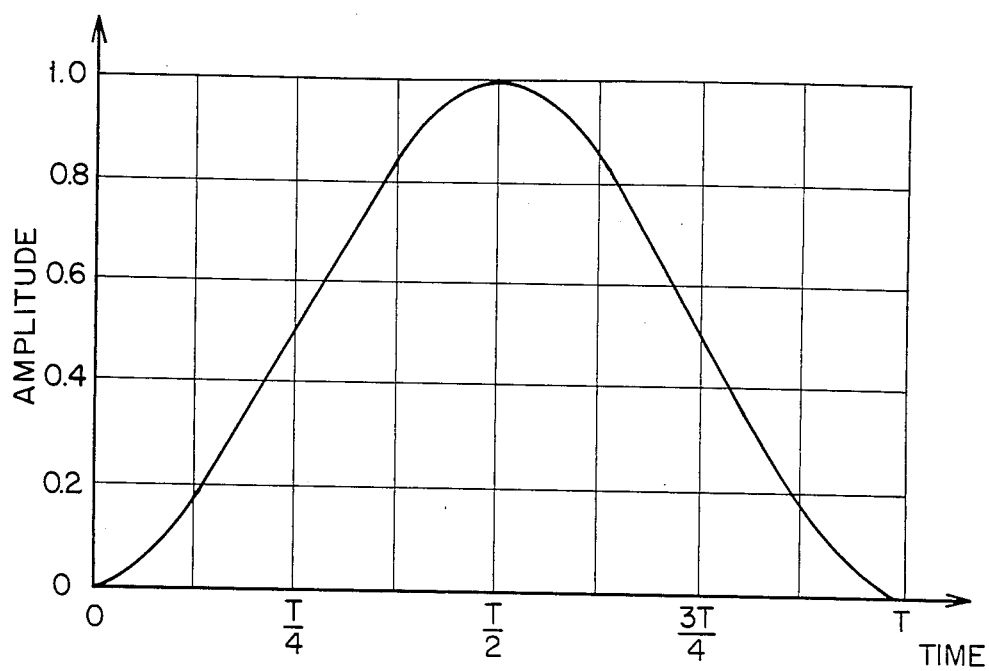
FIGS. 6A and 6B shows the time domain and frequency domain representation of the Hanning window function.
Figure 6B:
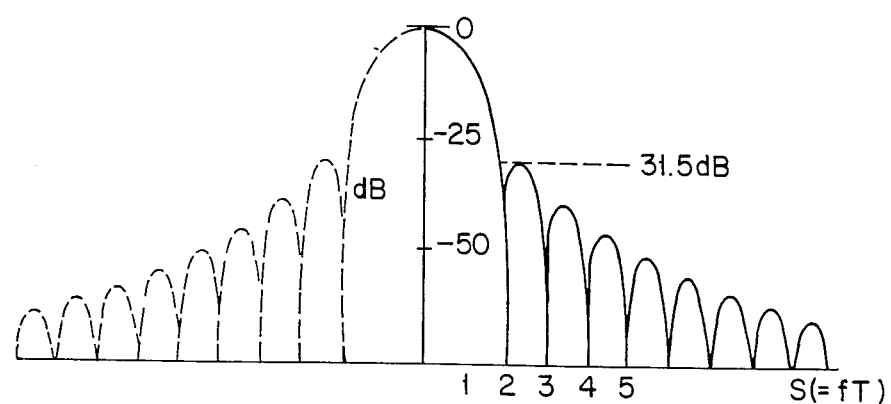
Figure 7A:
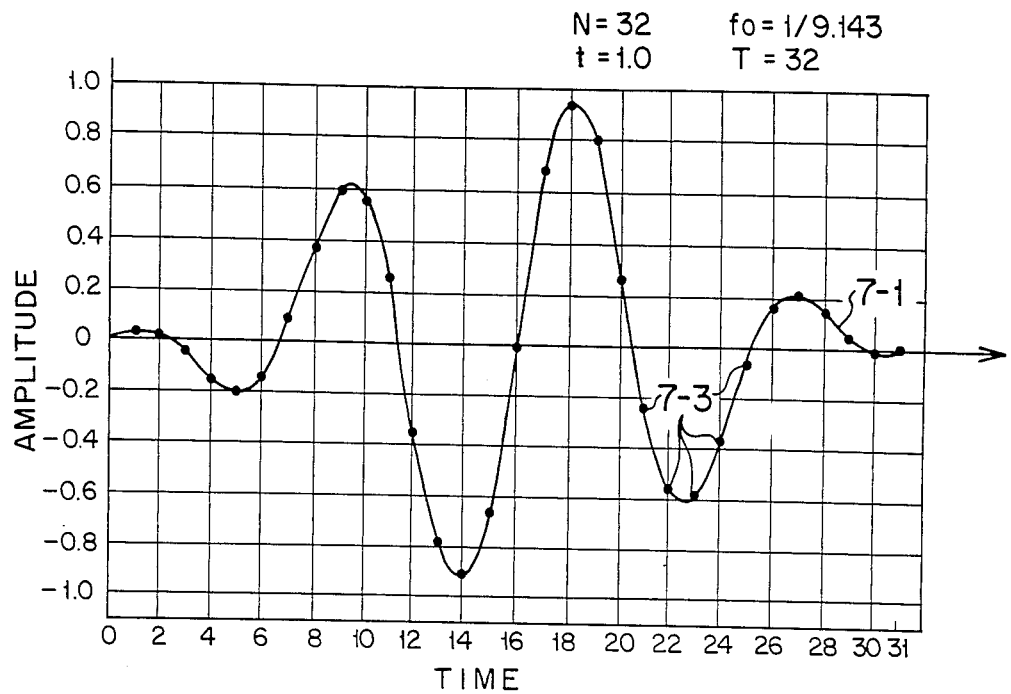
FIGS. 7A shows an input signal multiplied by the Hanning window function shown in FIG. 6A.
Figure 7B:
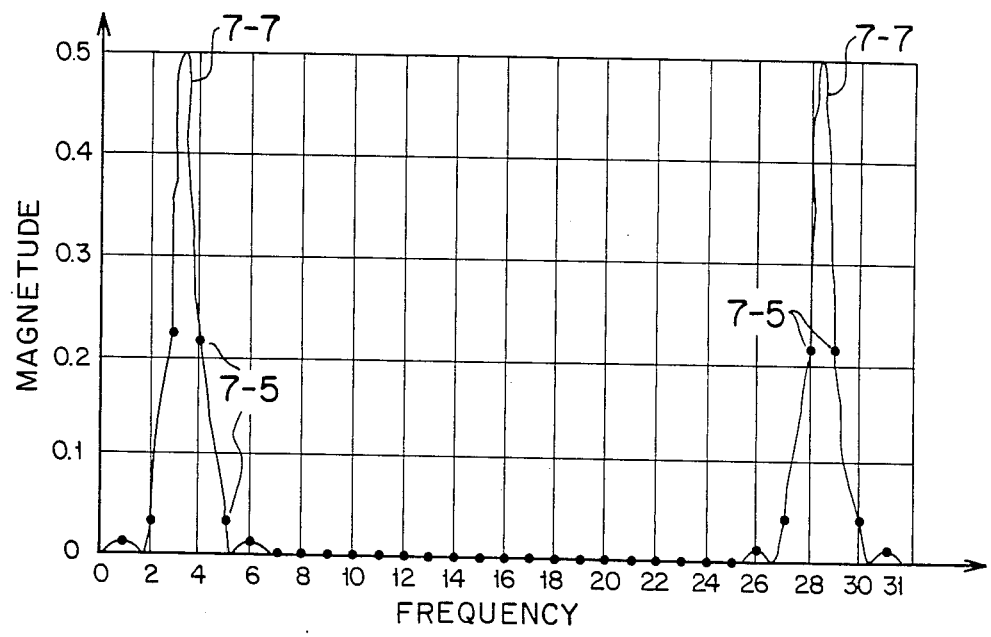
FIG. 7B shows the signal of FIG. 7A transformed into the frequency domain.
Figure 8:
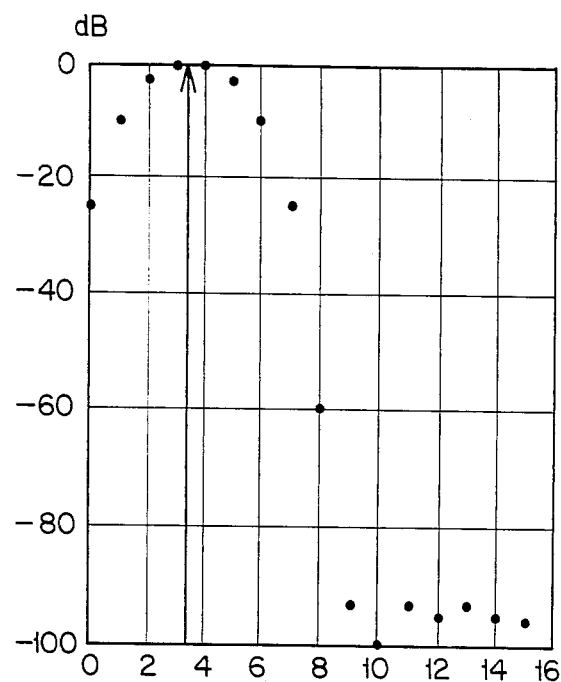
FIG. 8 shows an alternative shape of the window.

Unless there are reasons for the input signal to have spectra components locate close together, one can assume that $f_0$ and $f_1$ are phantom responses generated from one frequency component in the input signal which has an amplitude $a_{in}$ and located at frequency of $f_{in}$ as shown in FIG. 3.

FIG. 3 shows that spectra components $f_0$ and $f_1$ are exactly fitted by Fourier transform H(f) of Hanning window function with its center adjusted to $f_{in}$ on the frequency axis. This envelope is convolution of H(f) and the impulse at $f_{in}$.

Therefore, the levels $A_0$ and $A_1$ follow from the equations below. For the simplicity, H(F) is normalized to have $H(0) = 1$.

$$A_1 - A_0 = A_{in} \cdot H(f_1 - f_{in}) - A_{in} \cdot H(f_0 - f_{in})$$
$$= A_{in} \cdot [H(f_1 - f_{in}) - H((f_1 - f_{in}) - f_t)]$$
$$= A_{in} \cdot (H(g) - H(g - f_t))$$
$$= Y(g),$$

where $g = f_1 - f_{in}$.
Also, $$A_1 = A_{in} \cdot H(g) = A_{in} \cdot H(f_{in} - f_{in})$$

$$A_e = A_1/A_{in} = H(g).$$

Figure 1:
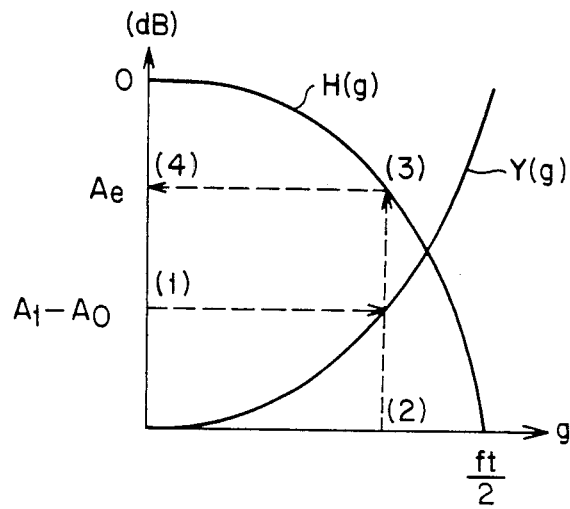
FIG. 1 is a graphical representation of the steps of the invention.

Accordingly, as shown in FIG. 1, g is computed from the observed level difference of $A_1 - A_0$ and the inverse function of Y. In FIG. 1, the broken lines from (1) to Y(G) then to (2) depicts graphical representation of the calculation.

Once the value of g is determined a ratio $A_e$ defined as $A_1/A_{in}$ can be computed immediately from H(g). This computation process is also graphically depicted along the broken lines from (2) to (3) then to (4) in FIG. 1.

As a result, $A_{in}$ and $f_{in}$ are subsequently computed using following equations.

$$A_{in} = A_1/A_e$$

$$f_{in} = f_1 - g.$$

Then observed spectra at frequencies $f_0$ and $f_1$ are deleted from the spectrum data set and the computed true spectrum replaces it.

In FIG. 1, $f_{in}$ is located between $f_1 - f_t/2$ and $f_1$. The same procedure is applicable where $f_{in}$ is located between $f_0$ and $f_0 + f_t/2$.

This broader noise bandwidth requires one to use components at frequencies ..., $f_{-2}$, $f_{-1}$, $f_2$, $f_3$, ..., close to $f_{in}$ to calculate the input's signal actual spectrum in addition to $f_0$ and $f_1$.

In the preferred embodiment, the power spectrum of an input signal is measured by using Hanning window. However, other types of windows may be substituted for the Hanning window.

For example, any type of windows including a rectangular window can be used. Also, other types of spectra such as complex frequency spectrum other than power spectrum can be measured using the method of this invention.

Where the frequency of measured signal is known its level is easily computed via processes depicted by broken lines of (2) to (3) then to (4) in FIG. 1.

As stated earlier the amplitude and the frequency of signal spectrum components are precisely determined by using the method of this invention on DFTed data.

I claim:
1. A method comprising the steps of:
sampling and digitizing an input signal;
multiplying said sampled and digitized input signal by a window having a known fourier transform;
obtaining the digital fourier transform of said input signal multiplied by said window;
selecting two spectral components;

fitting the fourier transform of said window to said selected spectral components; and determining the frequency components of said input signal from said fitting.

2. A method as in claim 1 wherein more than two spectral components are selected.

3. A method as in claim 1 wherein said input signal has one predominate frequency and wherein determining the frequency components of the input signal involves identifying the frequency where the fourier transform of the window fitted to said selected spectral components has its maximum amplitude.

4. A method as in claim 1 wherein the steps of fitting and determining further comprise:

using the difference in amplitude between said two spectral components and the inverse of y(g) to determine g; and determining the frequency of said input signal by subtracting said g from the frequency of a spectral component.

5. A method as in claim 4 further comprising the steps of:

determining the amplitude of H(g) at said g;

dividing the amplitude of said spectral component by the amplitude of H(g) at said g.

* * * * *